(12) United States Patent
Hong et al.

(10) Patent No.: US 7,936,028 B2
(45) Date of Patent: May 3, 2011

(54) SPIN FIELD EFFECT TRANSISTOR USING HALF METAL AND METHOD OF MANUFACTURING THE SAME

(75) Inventors: Ki-ha Hong, Seoul (KR); Sung-hoon Lee, Yongin-si (KR); Jong-seob Kim, Suwon-si (KR); Jai Kwang Shin, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/081,283

(22) Filed: Apr. 14, 2008

(65) Prior Publication Data

US 2009/0121267 A1   May 14, 2009

(30) Foreign Application Priority Data

Nov. 9, 2007   (KR) ........................ 10-2007-0114192

(51) Int. Cl.
*H01L 29/82* (2006.01)
(52) U.S. Cl. ................. 257/421; 257/295; 257/E29.323
(58) Field of Classification Search .................. 257/295, 257/E29.323, 421
See application file for complete search history.

(56) References Cited

U.S. PATENT DOCUMENTS

| | | | | |
|---|---|---|---|---|
| 7,602,636 B2 * | 10/2009 | Saito et al. | ..................... | 365/158 |
| 2005/0282379 A1 | 12/2005 | Saito et al. | | |
| 2006/0017080 A1 * | 1/2006 | Tanaka et al. | ................. | 257/295 |

FOREIGN PATENT DOCUMENTS

| | | |
|---|---|---|
| EP | 1610391 | 12/2005 |
| JP | 2004-111904 | 4/2004 |
| JP | 2006-032915 | 2/2006 |
| KR | 2006-0105949 | 10/2006 |
| KR | 100832583 | 5/2008 |

OTHER PUBLICATIONS

International Search Report dated May 18, 2009 in corresponding International Application No. PCT/KR2008/006477.

* cited by examiner

*Primary Examiner* — Victor Mandala
*Assistant Examiner* — Scott Stowe
(74) *Attorney, Agent, or Firm* — Harness, Dickey & Pierce, P.L.C.

(57) ABSTRACT

A spin field effect transistor may include at least one gate electrode, a channel layer, a first stack and a second stack separate from each other on a substrate, wherein the channel layer is formed of a half metal. The half metal may be at least one material selected from the group consisting of chrome oxide ($CrO_2$), magnetite ($Fe_3O_4$), a double perovskite structure material, a Heusler alloy, NiMnSb, $La_{(1-x)}A_xMnO_3$ (A=Ca, Ba, Sr, x~0.3), and GaN doped with Cu, and the double perovskite structure material is expressed as a chemical composition of $A_2BB'O_6$, and a material corresponding to A is Ca, Sr, or Ba, a material corresponding to B is a 3d orbital transition metal, and a material corresponding to B' is a 4d orbital transition metal. The 3d orbital transition metal may be Fe or Co, and the 4d orbital transition metal is Mo or Re.

20 Claims, 4 Drawing Sheets

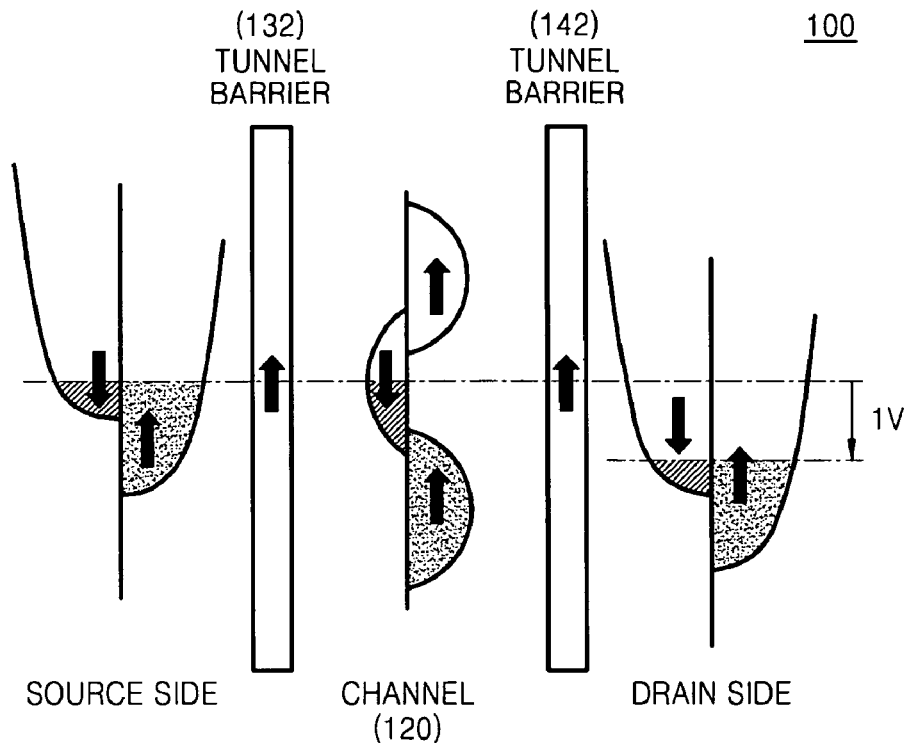
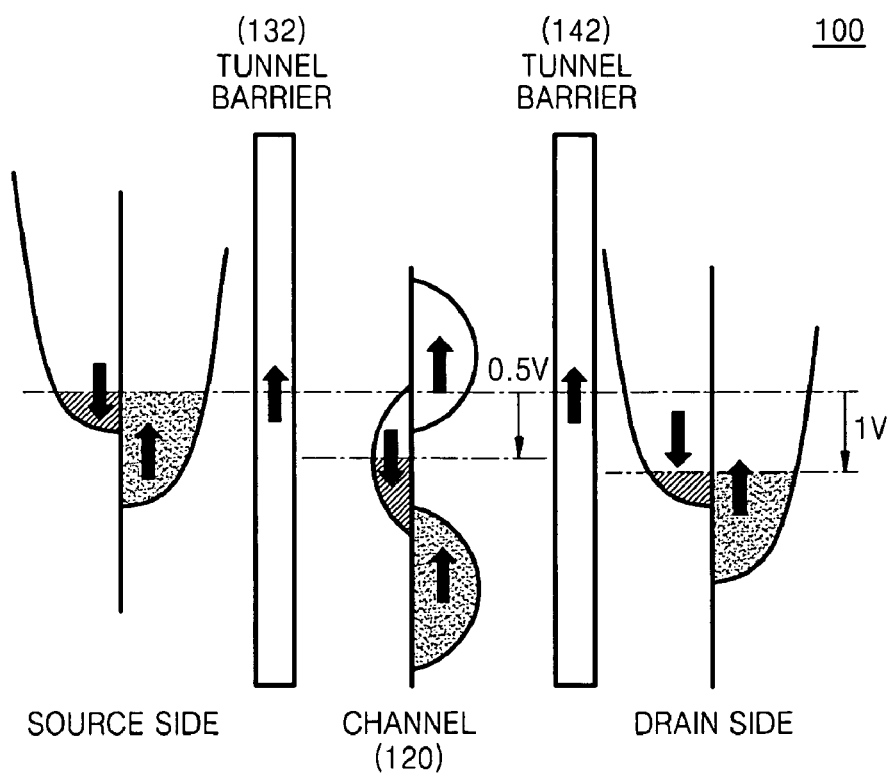

SPIN FIELD EFFECT TRANSISTOR USING HALF METAL AND METHOD OF MANUFACTURING THE SAME

PRIORITY STATEMENT

This application claims priority under U.S.C. §119 to Korean Patent Application No. 10-2007-0114192, filed on Nov. 9, 2007, in the Korean Intellectual Property Office (KIPO), the entire contents of which are incorporated herein by reference.

BACKGROUND

1. Field

Example embodiments relate to a spin field effect transistor that uses a half metal as a channel and a method of manufacturing the same.

2. Description of the Related Art

When semiconductor devices are manufactured to a nanoscale, the increasing rate of carrier mobility may not keep pace with the increasing rate of the semiconductor devices, and despite the reduction in the size of devices, the power requirement may not be reduced. In order to address these problems, a technique of using electron spin has been proposed.

As such, a spin field effect transistor may be turned on using the spin of electrons, and the power required for electron spinning may be smaller and the turn on speed may be faster. A half metal may have a semiconductor characteristic due to forming a band gap near a Fermi level in one direction among two spinning directions. And, in the other direction of the two spinning directions, the half metal may have a metal characteristic. A spin field effect transistor, in which source and drain electrodes may be formed of half metals, has been disclosed in the related art.

SUMMARY

To address the above and/or other problems, example embodiments provide a spin field effect transistor in which a half metal may be used as a channel and a method of manufacturing the same.

According to example embodiments, a spin field effect transistor may include at least one gate electrode, a channel layer, a first stack and a second stack separate from each other on a substrate, wherein the channel layer is formed of a half metal.

The half metal may be at least one material selected from the group consisting of chrome oxide ($CrO_2$), magnetite ($Fe_3O_4$), a double perovskite structure material, a Heusler alloy, NiMnSb, $La_{(1-x)}A_xMnO_3$ (A=Ca, Ba, Sr, x~0.3), and GaN doped with Cu, and the double perovskite structure material is expressed as a chemical composition of $A_2BB'O_6$, and a material corresponding to A is Ca, Sr, or Ba, a material corresponding to B is a 3d orbital transition metal, and a material corresponding to B' is a 4d orbital transition metal. The 3d orbital transition metal may be Fe or Co, and the 4d orbital transition metal is Mo or Re.

The channel layer may be on the at least one gate electrode, the first stack may include a first tunnel barrier and a source electrode sequentially formed on the channel layer, and the second stack may include a second tunnel barrier and a drain electrode sequentially formed on the channel layer. The source electrode and the drain electrode may be formed of a half metal. The source electrode and the drain electrode may have a semiconductor characteristic having a spin direction different from that of the channel layer.

The first stack may further include a first fixed layer, formed of a ferromagnetic material, between the first tunnel barrier and the source electrode, and the second stack may further include a second fixed layer, formed of a ferromagnetic material, between the second tunnel barrier and the drain electrode. In the source electrode, main spin electrons may be formed in a direction different from the spin direction of the channel layer having a semiconductor characteristic. The first and second tunnel barriers may be formed of a material having a tunneling magneto resistivity (TMR) phenomenon. The first and second tunnel barriers may be formed of MgO or $Al_2O_3$.

The spin field effect transistor may further include a first free layer, formed of a antiferromagnetic material, between the first tunnel barrier and the first fixed layer, and a second free layer, formed of a antiferromagnetic material, between the second tunnel barrier and the second fixed layer. The channel layer and the gate electrode may be sequentially formed on the first stack and the second stack.

The at least one gate electrode may be a first gate electrode and a second gate electrode, the first stack and the first gate electrode separate from each other on the substrate, the channel layer on the first stack and the first gate electrode, and the second stack and the second gate electrode on the channel layer to correspond to the first stack and the first gate electrode. The first stack may include a first electrode and a first tunnel barrier sequentially formed on the substrate, and the second stack may include a second tunnel barrier and a second electrode sequentially formed on the channel layer. The first electrode and the second electrode may be formed of a half metal. The first electrode and the second electrode may have a semiconductor characteristic having a different spin direction from that of the channel layer.

The first stack may further include a first fixed layer, formed of a ferromagnetic material, between the first tunnel barrier and the first electrode, and the second stack may further include a second fixed layer, formed of a ferromagnetic material, between the second tunnel barrier and the second electrode. One of the first electrode and the second electrode may be a source electrode, and the other one may be a drain electrode, and, in the source electrode, main spin electrons may be formed in a direction different from the spin direction of the channel layer having a semiconductor characteristic. The method may further include a first free layer, formed of a antiferromagnetic material, between the first tunnel barrier and the first fixed layer, and a second free layer, formed of a antiferromagnetic material, between the second tunnel barrier and the second fixed layer.

According to example embodiments, a method of manufacturing a spin field effect transistor may include forming at least one gate electrode, a channel layer, a first stack and a second stack separate from each other on a substrate, wherein the channel layer is formed of a half metal.

The half metal may be at least one material selected from the group consisting of chrome oxide ($CrO_2$), magnetite ($Fe_3O_4$), a double perovskite structure material, a Heusler alloy, NiMnSb, $La_{(1-x)}A_xMnO_3$ (A=Ca, Ba, Sr, x~0.3), and GaN doped with Cu, and the double perovskite structure material is expressed as a chemical composition of $A_2BB'O_6$, and a material corresponding to A is Ca, Sr, or Ba, a material corresponding to B is a 3d orbital transition metal, and a material corresponding to B' is a 4d orbital transition metal. The 3d orbital transition metal may be Fe or Co, and the 4d orbital transition metal is Mo or Re.

The channel layer may be formed on the at least one gate electrode, the first stack may include a first tunnel barrier and a source electrode sequentially formed on the channel layer, and the second stack may include a second tunnel barrier and a drain electrode sequentially formed on the channel layer. The channel layer and the gate electrode may be sequentially formed on the first stack and the second stack.

The at least one gate electrode may be a first gate electrode and a second gate electrode, the first stack and the first gate electrode formed separate from each other on the substrate, the channel layer formed on the first stack and the first gate electrode, and the second stack and the second gate electrode formed on the channel layer to correspond to the first stack and the first gate electrode.

BRIEF DESCRIPTION OF THE DRAWINGS

Example embodiments will be more clearly understood from the following detailed description taken in conjunction with the accompanying drawings. FIGS. 1-6 represent non-limiting, example embodiments as described herein.

FIG. 1 is a schematic cross-sectional view of a spin field effect transistor that uses a half metal, according to example embodiments;

FIGS. 2 and 3 are energy band diagrams of a source electrode side, a drain electrode side, a first tunnel barrier, and a second tunnel barrier, according to example embodiments;

FIG. 4 is a schematic cross-sectional view of a modified spin field effect transistor to the spin field effect transistor of FIG. 1;

FIG. 5 is a schematic cross-sectional view of a spin field effect transistor according to example embodiments; and FIG. 6 is a schematic cross-sectional view of a spin field effect transistor according to example embodiments.

Figure 1:
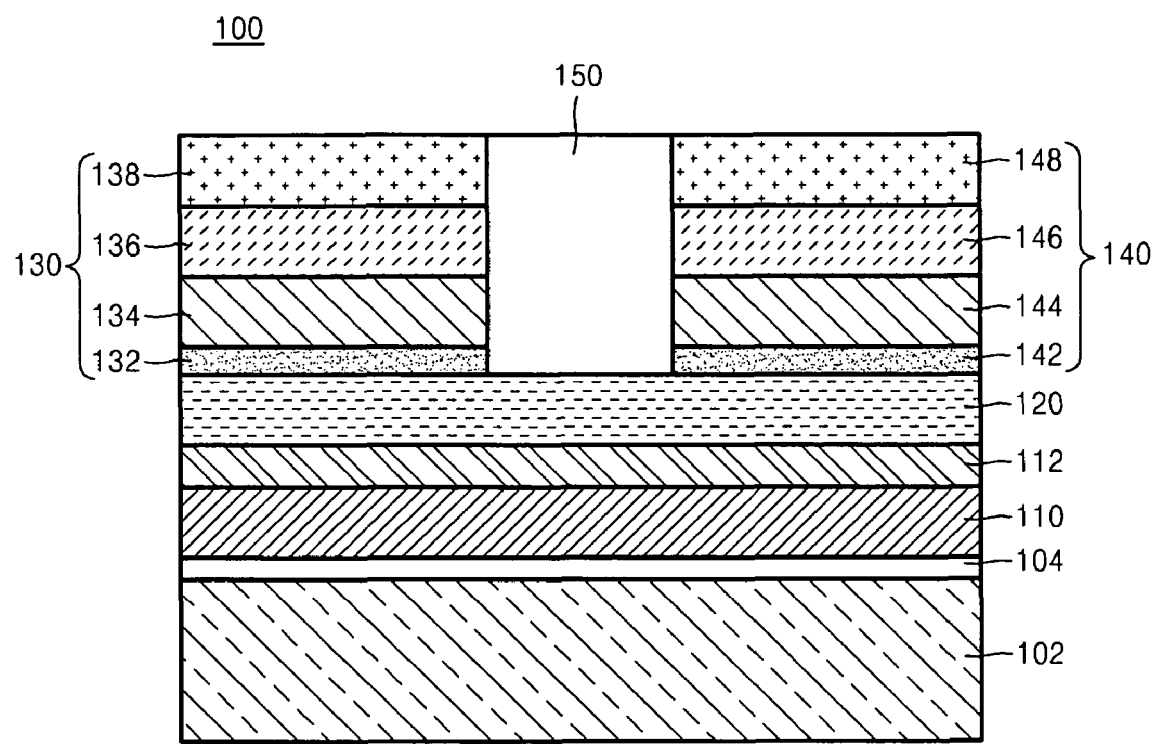

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings in which example embodiments may be shown. In the drawings, the thicknesses of layers and regions may be exaggerated for clarity. Like reference numerals denote like elements in the drawings and repetitive description thereof will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a schematic cross-sectional view of a spin field effect transistor 100 that uses a half metal, according to example embodiments. Referring to FIG. 1, an insulating layer 104 and a gate electrode 110 may be formed on a substrate 102. The substrate 102 may be a conventional silicon substrate, and the insulating layer 104 may be formed of silicon oxide. The gate electrode 110 may be formed of Al or polysilicon.

A gate oxide layer 112 and a channel layer 120 may be sequentially formed on the gate electrode 110. A first stack 130 and a second stack 140, which may be separated from each other, may be formed on the channel layer 120. The insulating layer 150 may be formed between the first stack 130 and the second stack 140 to separate the first stack 130 from the second stack 140. The gate oxide layer 112 may be formed of a silicon oxide. The first stack 130 may include a first tunnel barrier 132, a first free layer 134, a first fixed layer 136, and a source electrode 138 sequentially formed on the channel layer 120. The second stack 140 may include a second tunnel barrier 142, a second free layer 144, a second fixed layer 146, and a drain electrode 148 sequentially formed on the channel layer 120.

The channel layer 120 may be formed of a half metal that may be formed of an oxide group material, a double perovskite structure material, or a Heusler compound. The oxide group material may be $CrO_2$ or $Fe_3O_4$. The chemical composition of the double perovskite structure material may be expressed as $A_2BB'O_6$. A material corresponding to A may be Ca, Sr, or Ba, a material corresponding to B may be a 3d orbital transition metal, for example, Fe and Co, and a material corresponding to B' may be a 4d orbital transition metal, for example, Mo and Re. The double perovskite structure material may be, for example, $Sr_2FeMoO_6$ or $Sr_2FeReO_6$. The Heusler compound may be $Co_2CrAl$.

Besides the above-described half metal, a manganite group material, e.g., NiMnSb, $La_{(1-x)}A_xMnO_3$ (A=Ca, Ba, Sr, x~0.3), and a transition metal doped semiconductor, e.g., Cu doped GaN, may have the characteristic of a half metal, and may also be used as the channel layer 120. The half metal may have a semiconductor characteristic due to the forming of a gap near a Fermi level in one of a down-spin direction or an up-spin direction, and may have a metal characteristic in the other direction. The channel layer 120 may be formed of a material having a semiconductor characteristic in a predominant electron spin direction of the first and second fixed layers 136 and 146.

The first and second tunnel barriers 132 and 142 may be of the same material disposed between both magnetization layers in a tunneling magneto resistivity (TMR) device, for example, MgO or $Al_2O_3$. For example, if MgO is used to form the first and second tunnel barriers 132 and 142, a magneto resistance (MR) ratio may be increased to about 1000% or more through a spin filtering, and a MR ratio of about 400% may be experimentally obtained.

The first and second fixed layers 136 and 146 may be layers in which each of the magnetization spin direction may be fixed and may be formed of a ferromagnetic metal. The first and second fixed layers 136 and 146 may be predominantly formed in a direction in which the spin direction may be the same. The ferromagnetic metal may be a NiFe alloy or a CoFe alloy, and the ferromagnetic metal may have a density of state (DOS) higher in one direction than the other direction, for example, the density of up-spin electrons may be higher than that of down-spin electrons. However, in a normal metal, the DOS of up-spin electrons and down-spin electrons may be the same.

The first and second free layers 134 and 144 may further be formed under the first and second fixed layers 136 and 146. The first and second free layers 134 and 144 may be disposed to have spin directions identical to the spin directions of the first and second fixed layers 136 and 146, and may stabilize the spin direction of the first and second fixed layers 136 and 146. The first and second free layers 134 and 144 may be formed of a antiferromagnetic material, e.g., FeMn, PtMn, or PtCrMn. The source electrode 138 may be formed of a ferromagnetic metal, and may be formed to have a spin direction that may be the same as that of the first fixed layer 136. The drain electrode 148 may be formed of a ferromagnetic metal or a normal metal. If the drain electrode 148 may be formed of a ferromagnetic metal, the drain electrode 148 may be formed to have a spin direction that may be the same as that of the second fixed layer 146.

A method of operating the spin field effect transistor 100 of FIG. 1 will now be described with reference to FIGS. 2 and 3. FIGS. 2 and 3 are energy band diagrams of a source electrode side, a drain electrode side, a first tunnel barrier, and a second tunnel barrier, according to example embodiments. The source side may be a ferromagnetic material or a half metal on the first tunnel barrier 132. The drain side may be a ferromagnetic material or a half metal on the second tunnel barrier 142. Referring to FIG. 2, the spin directions of the source side and the drain side may be formed in an up-spin direction. A 1V bias voltage may be applied to the drain side so that the electron spin may move from the source side to the drain side, and a ground voltage may be applied to the source side.

The half metal channel layer 120 may be formed of material having characteristics in which a down-spin direction may have a metal characteristic and an up-spin direction may have a semiconductor characteristic with a gap. In each of the source and drain sides, the up-spin direction may be predominant. In the source side, the amount of down-spin electrons, which may be minor carriers, may be relatively low, and the first tunnel barrier (a MgO layer) may selectively allow tunnelling of up-spin electrons, which may be major carriers. The channel layer 120 may block the flow of up-spin electrons from moving to the drain side, and thus, no current flows in the channel layer 120. For example, the spin field effect transistor 100 may be in an OFF state.

Referring to FIG. 3, when a gate voltage of 0.5V is applied to the gate electrode 110, a conduction band of the up-spin electrons of the channel layer 120 may be aligned with the Fermi level in the source side, and thus, the up-spin electrons in the source side may move to the channel layer 120 through the first tunnel barrier 132, and the up-spin electrons in the channel layer 120 may move to the drain side through the second tunnel barrier 142. Thus, a current may flow in the channel layer 120 and the current may be measured in the drain electrode 148, for example, the spin field effect transistor 100 may be in an ON state.

Figure 4:
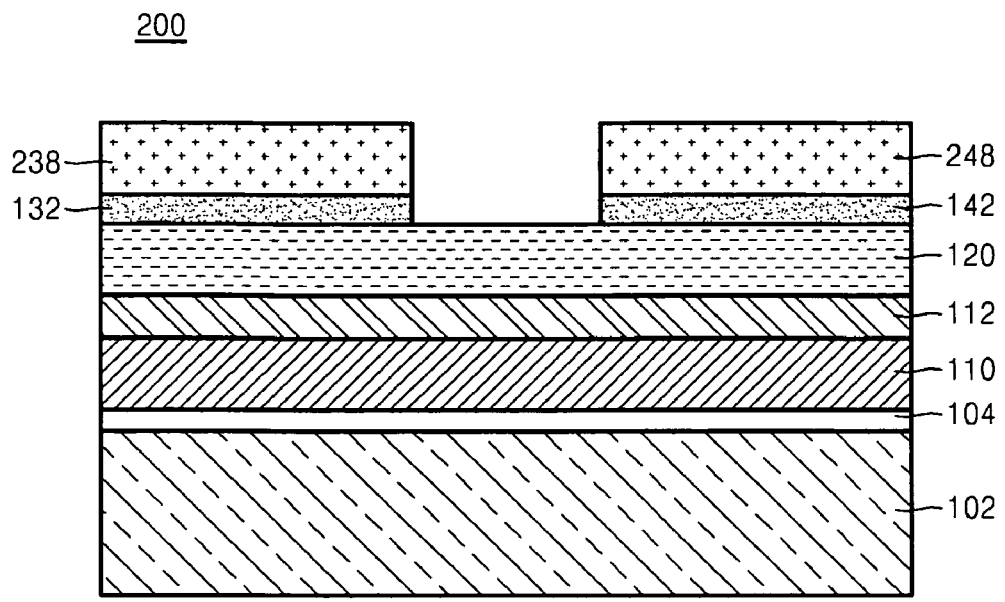

FIG. 4 is a schematic cross-sectional view of a modified spin field effect transistor 200 to the spin field effect transistor of FIG. 1. Referring to FIG. 4, the first and second tunnel barriers 132 and 142, separate from each other, may be formed on the channel layer 120, and a source electrode 238 and a drain electrode 248 may be formed on the first and second tunnel barriers 132 and 142. The source electrode 238 may be formed of a half metal, and may be formed of a material having a semiconductor characteristic with a gap formed in a spin direction different from that of the channel layer 120. For example, referring to FIGS. 2 and 3, in the source electrode 238, the up-spin electrons may have a metal characteristic and the down-spin electrons may have a semiconductor characteristic.

The drain electrode 248 may be formed of a half metal, and may be formed of a material having a semiconductor characteristic with a gap formed in a spin direction different from that of the channel layer 120. For example, the drain electrode 248 may be formed of the same material as the source electrode 238.

The source electrode 238 provides up-spin electrons like the source electrode side in FIGS. 2 and 3, and the operation of the spin field effect transistor 200 may be substantially identical to that of the spin field effect transistor 100, and thus, the detailed description thereof will not be repeated.

Figure 5:
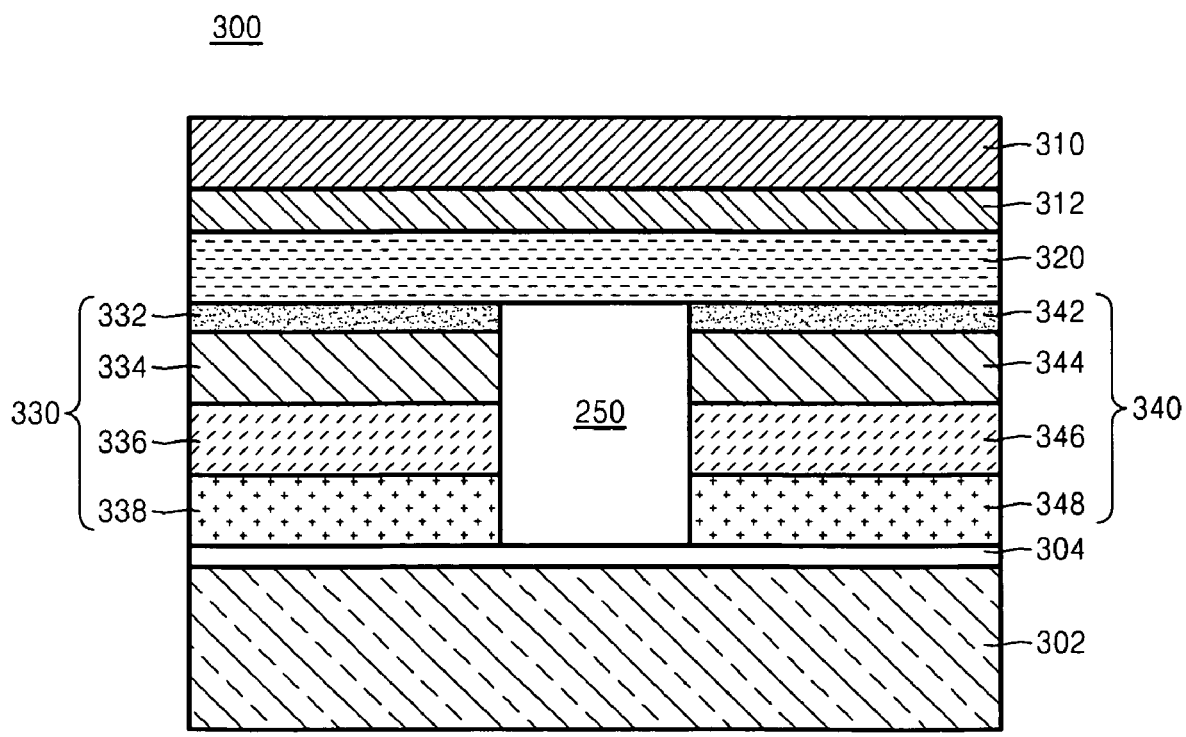

FIG. 5 is a schematic cross-sectional view of a spin field effect transistor 300 that uses a half metal, according to example embodiments. Referring to FIG. 5, an insulating layer 304 may be formed on a substrate 302, and a first stack 330 and a second stack 340, separate from each other, may be formed on the insulating layer 304. The insulating layer 250 may be formed between the first and second stacks 330 and 340 to separate the first stack 330 from the second stack 340. A channel layer 320, a gate oxide layer 312, and a gate electrode 310 may be sequentially formed on the first and second stacks 330 and 340.

The first stack 330 may include a source electrode 338, a first fixed layer 336, a first free layer 334, and a first tunnel barrier 332 sequentially formed on the insulating layer 304, and the second stack 340 may include a drain electrode 348, a second fixed layer 346, a second free layer 344, and a second tunnel barrier 342 sequentially formed on the insulating layer 304. The source electrode 338 may be formed of a ferromagnetic metal. The drain electrode 348 may be formed of a ferromagnetic metal or a normal metal.

The first and second fixed layers 336 and 346 may have fixed magnetization directions and may be formed of ferromagnetic metals. The first and second fixed layers 336 and 346 may have electron spins predominantly formed in the same direction. First and second free layers 334 and 344 may be formed on the first and second fixed layers 336 and 346. The first and second free layers 334 and 344 may be formed to have spin directions identical to those of the first and second fixed layers 336 and 346, and may stabilize the spin directions of the first and second fixed layers 336 and 346. The first and second tunnel barriers 332 and 342 may be the same material as a material, for example, MgO or $Al_2O_3$, disposed between both side magnetization layers in a TMR device.

The channel layer 320 may be formed of a half metal that may be formed of chrome oxide ($CrO_2$), magnetite ($Fe_3O_4$), manganese arsenide (MnAs), and a Heusler alloy. The channel layer 320 may have a semiconductor characteristic due to forming a gap near a Fermi level in one of a down-spin direction and an up-spin direction, and may have a metal characteristic in the other direction. The channel layer 320 may be formed of a material having a semiconductor characteristic in a predominant electron spin direction of the first and second fixed layers 336 and 346. The gate electrode 310 may be formed of a well-known conventional material, for example, Al or polysilicon. The gate oxide layer 312 may be formed of silicon oxide.

Figure 6:
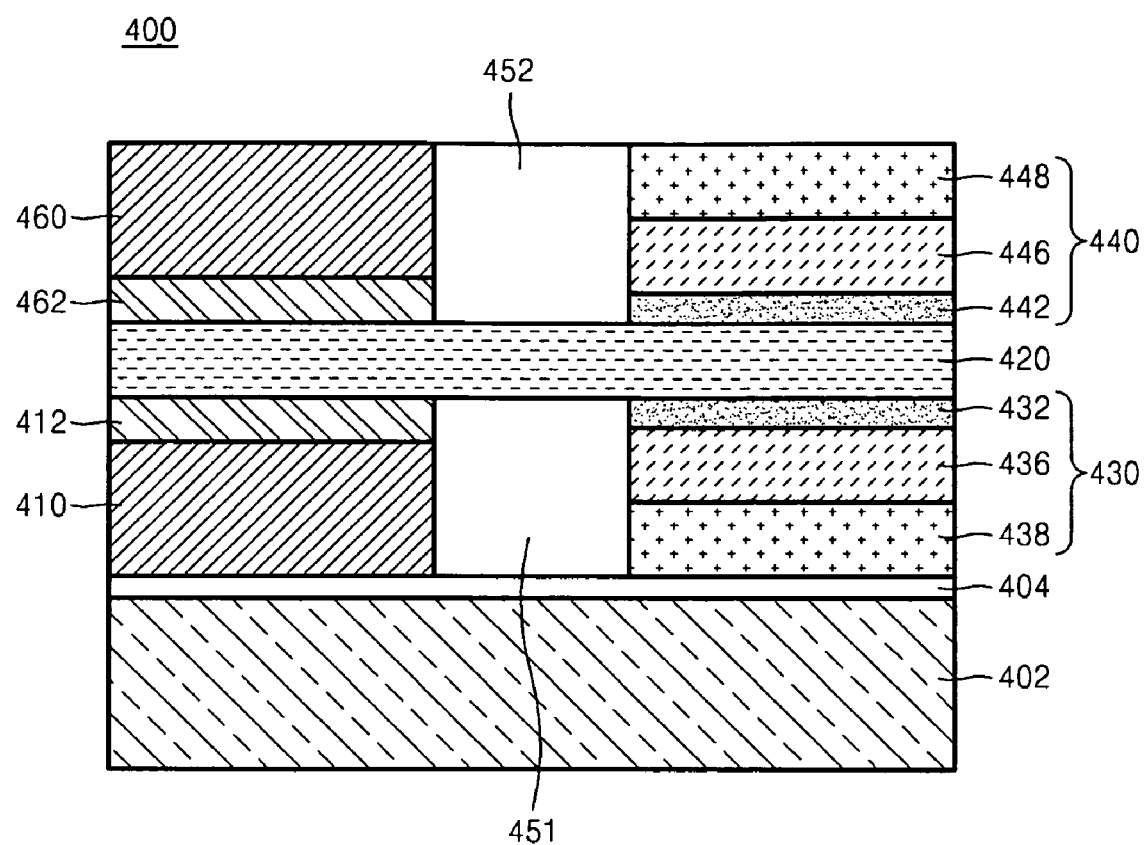

FIG. 6 is a schematic cross-sectional view of a spin field effect transistor 400 that uses a half metal, according to example embodiments. Referring to FIG. 6, an insulating layer 404 may be formed on a substrate 402, and a first gate electrode 410 and a first stack 430 may be formed on the insulating layer 404. An insulating layer 451 may be formed between the first gate electrode 410 and the first stack 430 to separate the first gate electrode 410 from the first stack 430. The first stack 430 may include a first electrode 438, a first fixed layer 436, and a first tunnel barrier 432 sequentially formed on the insulating layer 404. A first gate oxide layer 412 may be formed on the first gate electrode 410. A channel layer 420 may be formed on the first gate oxide layer 412 and the first tunnel barrier 432 to correspond to the first tunnel barrier 432 and the first gate electrode 410.

A second stack 440 and a second gate electrode 460 may be formed on the channel layer 420. A second gate oxide layer 462 may be formed between the second gate electrode 460 and the channel layer 420. An insulating layer 452 may be formed between the second stack 440 and the second gate electrode 460 to separate the second stack 440 from the second gate electrode 460. The second stack 440 may include a second tunnel barrier 442, a second fixed layer 446, and a second electrode 448 sequentially formed on the insulating layer 420.

The first electrode 438 and the second electrode 448 may be formed as one of a source electrode and/or a drain electrode. A gate voltage may be applied to at least one of the first gate electrode 410 and the second gate electrode 460. As a result, the electron spin may be moved from the source electrode side to the drain electrode side, for example, the spin field effect transistor 400 may be turned ON. In the spin field effect transistor 400 according to example embodiments, the channel path from the source electrode 438 to the drain electrode 448 may be shorter, and thus, an operational error of the spin field effect transistor 400 due to the change of spin direction may be reduced.

The spin field effect transistor that uses a half metal according to example embodiments may have increased charge mobility as compared to a conventional semiconductor device. Also, in the spin field effect transistor, the power needed to change the direction of the electron spin may be smaller than the power required to change the electrons. Thus, the amount of power required for the operation may be reduced. Accordingly, a relatively small spin field effect transistor may be manufactured through a scale down.

While example embodiments have been particularly shown and described with reference to example embodiments thereof, it will be understood by one of ordinary skill in the art that various changes in form and details may be made therein without departing from the spirit and scope of the following claims.

What is claimed is:

1. A spin field effect transistor comprising:
    at least one gate electrode, a channel layer, a first stack and a second stack separate from each other on a substrate,
    wherein the channel layer is formed of at least one material selected from the group consisting of chrome oxide ($CrO_2$), magnetite ($Fe_3O_4$), a double perovskite structure material, and a Heusler alloy, and the double perovskite structure material is expressed as a chemical composition of $A_2BB'O_6$, and a material corresponding to A is Ca, Sr, or Ba, a material corresponding to B is a 3d orbital transition metal, and a material corresponding to B' is a 4d orbital transition metal.

2. The spin field effect transistor of claim 1, wherein the 3d orbital transition metal is Fe or Co.

3. The spin field effect transistor of claim 1, wherein the 4d orbital transition metal is Mo or Re.

4. The spin field effect transistor of claim 1, wherein the channel layer is on the at least one gate electrode, and wherein
    the first stack includes a first tunnel barrier and a source electrode sequentially formed on the channel layer, and
    the second stack includes a second tunnel barrier and a drain electrode sequentially formed on the channel layer.

5. The spin field effect transistor of claim 4, wherein the source electrode and the drain electrode are formed of a half metal.

6. The spin field effect transistor of claim 5, wherein the source electrode and the drain electrode have a semiconductor characteristic having a spin direction different from that of the channel layer.

7. The spin field effect transistor of claim 4, wherein the first stack further comprises a first fixed layer, formed of a ferromagnetic material, between the first tunnel barrier and the source electrode, and the second stack further comprises a second fixed layer, formed of a ferromagnetic material, between the second tunnel barrier and the drain electrode.

8. The spin field effect transistor of claim 7, wherein, in the source electrode, main spin electrons are formed in a direction different from the spin direction of the channel layer having a semiconductor characteristic.

9. The spin field effect transistor of claim 4, wherein the first and second tunnel barriers are formed of a material having a tunneling magneto resistivity (TMR) phenomenon.

10. The spin field effect transistor of claim 9, wherein the first and second tunnel barriers are formed of MgO or $Al_2O_3$.

11. The spin field effect transistor of claim 7, further comprising:
a first free layer, formed of a antiferromagnetic material, between the first tunnel barrier and the first fixed layer, and
a second free layer, formed of a antiferromagnetic material, between the second tunnel barrier and the second fixed layer.

12. The spin field effect transistor of claim 1, wherein the channel layer and the gate electrode are sequentially formed on the first stack and the second stack.

13. The spin field effect transistor of claim 1, wherein the at least one gate electrode is a first gate electrode and a second gate electrode, the first stack and the first gate electrode separate from each other on the substrate, the channel layer on the first stack and the first gate electrode, and the second stack and the second gate electrode on the channel layer to correspond to the first stack and the first gate electrode.

14. The spin field effect transistor of claim 13, wherein the first stack includes a first electrode and a first tunnel barrier sequentially formed on the substrate, and the second stack includes a second tunnel barrier and a second electrode sequentially formed on the channel layer.

15. The spin field effect transistor of claim 14, wherein the first electrode and the second electrode are formed of a half metal.

16. The spin field effect transistor of claim 15, wherein the first electrode and the second electrode have a semiconductor characteristic having a different spin direction from that of the channel layer.

17. The spin field effect transistor of claim 13, wherein the first stack further comprises a first fixed layer, formed of a ferromagnetic material, between the first tunnel barrier and the first electrode, and
the second stack further comprises a second fixed layer, formed of a ferromagnetic material, between the second tunnel barrier and the second electrode.

18. The spin field effect transistor of claim 17, wherein one of the first electrode and the second electrode is a source electrode, and the other one is a drain electrode, and, in the source electrode, main spin electrons are formed in a direction different from the spin direction of the channel layer having a semiconductor characteristic.

19. The spin field effect transistor of claim 13, further comprising:
a first free layer, formed of a antiferromagnetic material, between the first tunnel barrier and the first fixed layer, and
a second free layer, formed of a antiferromagnetic material, between the second tunnel barrier and the second fixed layer.

20. The spin field effect transistor of claim 4, further comprising:
an insulating layer between the first stack and the second stack on the channel layer.

* * * * *